United States Patent [19]

Fujita et al.

[11] 4,227,162

[45] Oct. 7, 1980

[54] ELECTROMAGNET RELAY WITH SPECIFIC HOUSING STRUCTURE

[75] Inventors: Teizo Fujita, Ibaraki; Toyokazu Ikebata, Amagasaki; Harumi Fujisato, Takaishi, all of Japan

[73] Assignee: Izumi Denki Corporation, Osaka, Japan

[21] Appl. No.: 16,704

[22] Filed: Feb. 28, 1979

[30] Foreign Application Priority Data

Mar. 8, 1978 [JP] Japan .................................. 53-27069

[51] Int. Cl.² ..................... H01H 45/02; H01H 45/14
[52] U.S. Cl. .................................. 335/202; 335/106; 335/135
[58] Field of Search ............... 335/202, 132, 128, 135, 335/106, 203, 162, 278

[56] References Cited

U.S. PATENT DOCUMENTS

| | | | |
|---|---|---|---|
| 3,183,324 | 5/1965 | Smith | 335/128 |
| 3,811,102 | 5/1974 | Ash | 335/106 |
| 4,008,447 | 2/1977 | Anderson | 335/128 |
| 4,045,752 | 8/1977 | Frigo | 335/203 |
| 4,112,399 | 9/1978 | Pracher et al. | 335/202 |

Primary Examiner—Harold Broome
Attorney, Agent, or Firm—Pollock, Vande Sande & Priddy

[57] ABSTRACT

An electromagnet relay is disclosed. The relay comprises at least one electromagnet relay-contact assembly and a housing for containing the electromagnet relay-contact assembly. The electromagnet relay-contact assembly comprises at least one contact block including at least one of a normally-open contact and a normally-closed contact, an electromagnet device including a coil wound on an iron core and a relay armature for actuating the contacts by energization of the coil, and lead-out terminals for the contacts and the coil. The bottom wall of the housing is formed with a downwardly-protruded expansion, and a recess is formed in the inner surface of the bottom wall corresponding to the expansion. The electromagnet relay-contact assembly is contained in the inner space of the housing in such a manner that the lower half of the coil is substantially placed within the recess. The lead-out terminals are extended downwardly through longitudinal flat portions connected with the expansion of the bottom wall.

30 Claims, 21 Drawing Figures

FIG. 21 ial portion 4a
ELECTROMAGNET RELAY WITH SPECIFIC HOUSING STRUCTURE

BACKGROUND OF THE INVENTION

The present invention relates to an electromagnet relay, or more in particular to a small-sized or miniature electromagnet relay (hereinafter referred to as "relay") of a flat-type or the like which may be mounted direclty on a printed-circuit board.

The relay mounted on a printed-circuit board is required to be as compact and low in mounting height as possible in view of the positional relation with the other electronic parts including ICs.

SUMMARY OF THE INVENTION

An object of the present invention is to provide a relay which has been reduced in size by eliminating the useless space in the arrangement of the related members thereof.

Another object of the present invention is to provide a miniature relay which is low in height in the mounted condition, or particularly a miniature relay of which, when mounted with a socket, the height from the printed-circuit board is substantially the same as that of the relay proper, and which, when mounted directly on the printed-circuit board, is lower than the relay proper.

Still another object of the present invention is to provide a miniature relay which can be mounted on the printed-circuit board very easily in assembly work.

DESCRIPTION OF THE PREFERRED EMBODIMENTS

Prior to explanation of preferred embodiments of the present invention, disadvantages of conventional relays will be described with reference to FIGS. 1 to 3 for facilitating the understanding of the present invention.

Figures 1, 2, 3:
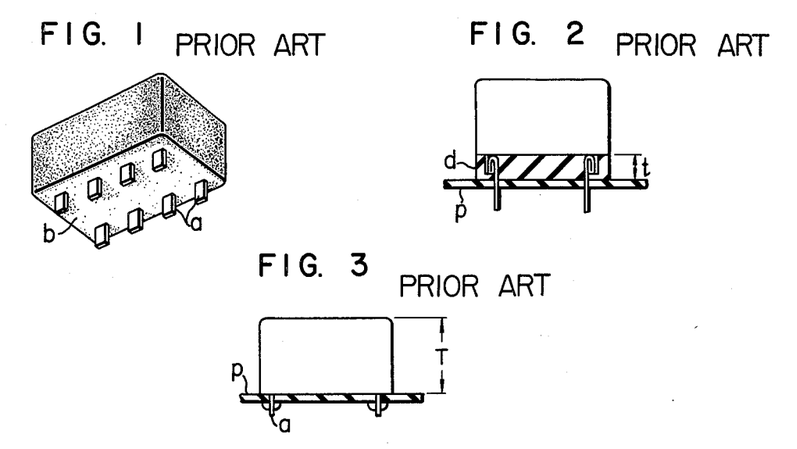
FIG. 1 is a perspective view from under a conventional relay.
FIGS. 2 and 3 are diagrams showing mounted conditions of the relay of FIG. 1.
Figure 4:
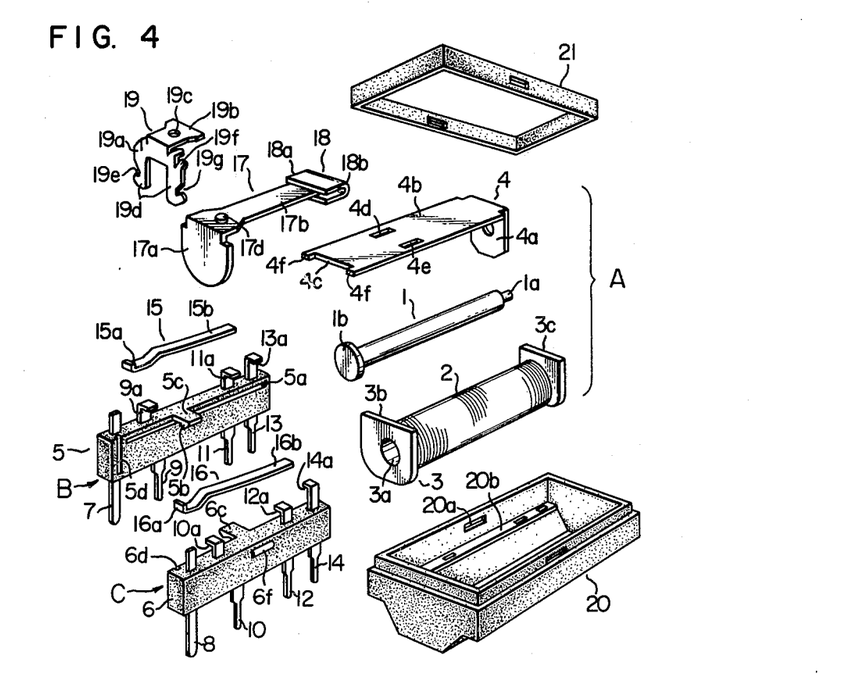
FIG. 4 is an exploded perspective view showing an embodiment of the relay according to the present invention.
Figure 5:
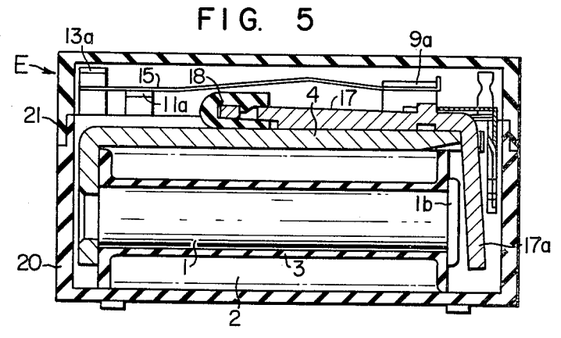
FIG. 5 is a longitudinal front view showing the assembled condition of the relay of FIG. 4.
Figure 6:
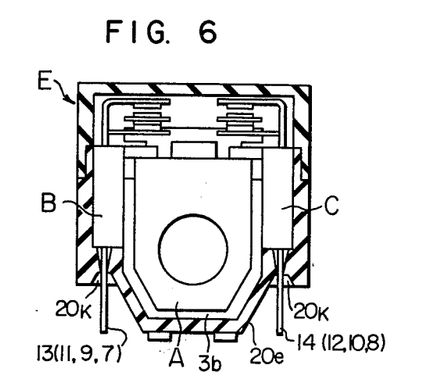
FIG. 6 is a longitudinal side view of the relay shown in FIG. 5.

As shown in FIGS. 1 to 3, a conventional relay of this type has a substantially flat bottom wall b from which terminals a are protruded. The bottom wall surface b is usually covered with a resin material to seal the relay. When this relay is mounted directly on a printed-circuit board P, the very height of the relay T represents the mounting height (FIG. 3). In the case where the relay is mounted through a socket d, on the other hand, the relay height T plus the socket height t represents the mounting height. In relation with the other electronic parts such as ICs, it is required by users that the mounting height of the relay also be lowered. Being covered with resin at the whole bottom wall surface b, the conventional relay has such further drawbacks that the bottom surface is apt to become irregular, that a large amount of resin is requires, and that the resin portion does not dry easily because of its large amounts.

Figure 7:
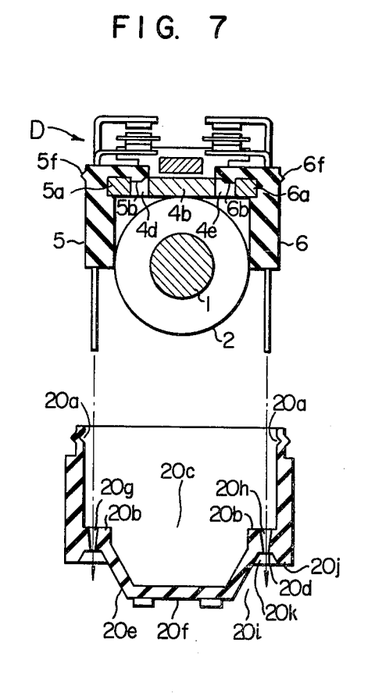
FIG. 7 is a longitudinal sectional view in the deassembled condition taken substantially at the central part of the relay of FIG. 6 and showing the electromagnet relay-contact assembly and the bottom part of the housing thereof.
Figure 8:
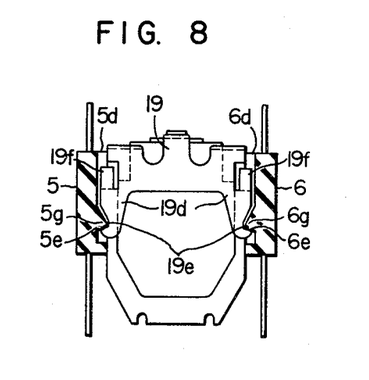
FIG. 8 is a longitudinal sectional view showing an end of the electromagnet relay contact assembly.
Figure 9:
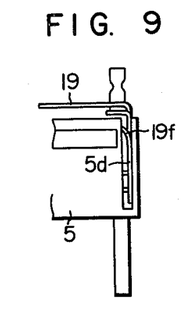
FIG. 9 is a partial front view of the end shown in FIG. 8.

Preferred embodiments of the present invention will be now described in detail below with reference to FIGS. 4 to 21. In FIGS. 4 to 12, reference numeral 1 shows a core, numeral 2 an electromagnetic coil wound around a bobbin 3, numeral 4 a yoke bent in the shape of ⏋. An end 1a of the core 1 inserted into the central hole 3a of the bobbin 3 is secured to the vertical portion 4a of the yoke 4, so that the yoke 4, the bobbin 3 and the core 1 are integrated, thus constituting an electromagnet block A. The horizontal portion 4b of the yoke 4 is extended in parallel to the core 1 and has an end 4c thereof positioned correspondingly to the other end 1b of the core 1. Numerals 5, 6 show insulating mounts made of a resin material, on which coil terminals 7, 8, contact common terminals 9, 10, normally-closed contact terminals 11, 12 and normally-open contact terminals 13, 14 are molded respectively integrally in parallel thereby to constitute contact blocks B and C respectively. The contact blocks B and C are arranged on the respective sides of the electromagnet block A, so that the coil terminals 7 and 8, the contact common terminals 9 and 10, the normally-closed contact terminals 11 and 12, and the normally-open contact terminals 13 and 14 are respectively positioned in opposed relation to each other. The normally-closed contact terminals 11, 12 and the normally-open contact terminals 13, 14 have stationary contacts 11a, 12a and 13a, 14a respectively formed at the upper ends thereof bent toward each other. The normally-closed stationary contacts 11a, 12a and the normally-open stationary contacts 13a, 14a are positioned at different heights. In other words, the normally-closed contacts 11a, 12a are different in height from the normally-open contacts 13a, 14a. Numerals 15, 16 show movable contact members of an elastic conductive material including lower ends 15a and 16a respectively secured by spot welding or like means to the upper end bent portions 9a and 10a of the common terminals 9 and 10 respectively, and free-end contacts 15b and 16b interposed between the normally-closed contacts 11a, 12a and the normally-open contacts 13a, 14a respectively. The free-end contacts 15b and 16b are normally in contact with the normally-closed contacts 11a and 12a respectively. The upper ends of the coil terminals 7 and 8 are connected to the coil ends of the electromagnetic coil 2 respectively. The contact blocks B and C thus constructed are mounted on the sides of the electromagnet block A. For the purpose of mounting of the contact blocks B and C, longitudinal slots 5a and 6a are formed in the inner upper end parts of the insulating mounts 5 and 6, and tongues 5c and 6c having protrusions 5b and 6b respectively underside are protruded from the part substantially above the central part of the slots 5a and 6a. The yoke 4 has holes 4d and 4e formed in the vicinity of the side edges of the horizontal part 4b thereof. With the side edges of the horizontal part 4b of the yoke 4 fitted into the slots 5a and 6a of the insulating mounts 5 and 6 respectively and with the inner surfaces of the ends of the insulating mounts 5 and 6 kept in contact with the side edges of the flanges 3b and 3c of the bobbin 3 respectively, the protrusions 5b and 6b of the tongues 5c and 6c are fitted into engagement with the holes 4d and 4e of the horizontal part 4b of the yoke 4 (FIG. 7). In the condition where the contact blocks B and C are mounted on the electromagnet block A as mentioned above (FIG. 7), the insulating mounts 5 and 6 of the contact blocks B and C are positioned as close to the electromagnetic coil 2 as possible in the space above the plane contaning the longitudinal axis of the coil 2, in such a manner that the terminals 7, 9, 11, 13 and 8, 10, 12, 14 protruded downward from the insulating mounts 5 and 6 respectively are arranged in spaced relation with the electromagnetic coil 2 and the bobbin flanges 3b, 3c. In other words, the terminals 7, 9, 11, 13 and 8, 10, 12, 14 are positioned in the space formed between the lower part of the insulating mounts 5, 6 and the electromagnetic coil 2 and the bobbin flanges 3b, 3c. The electromagnetic coil 2 is wound in circles in section, and the lower part of the bobbin flanges 3b and 3c are formed in semicircular (not shown) or inverted trapezoidal shape in conformity with the outline of the electromagnetic coil 2, thereby maximizing the above-mentioned space. Numeral 17 shows a relay armature bent in the shape of ⌈, which is supported on the end 4c of the horizontal part 4b of the yoke 4 at the corner portion thereof. In the assembling process, the corner portion of the relay armature 17 is fitted into the recess between the protrusions 4f, 4f formed at the corners of the end 4c, thereby preventing the relay armature 17 from being displaced laterally.

Figure 13:
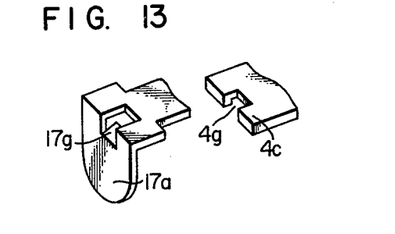
FIG. 13 is a partial perspective view showing another embodiment of the support for the relay armature.

The method for preventing the lateral displacement of the relay armature 17 in the supported condition thereof is not necessarily limited to the one mentioned above. As an alternative, for instance, an inwardly-bent protrusion 17g is formed at the corner portion of the relay armature 17 as shown in FIG. 13, and a recess 4g adapted for mating the protrusion 17g is formed at the end 4c of the yoke 4.

Figure 10:
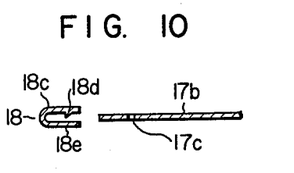
FIG. 10 is a longitudinal sectional view showing a dismantled relay armature and an actuator.
Figure 11:
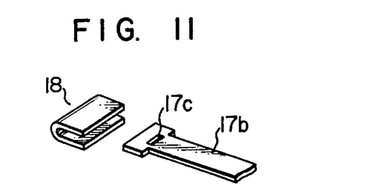
FIG. 11 is a perspective view showing the dismantled relay armature and actuator shown in FIG. 10.
Figure 12:
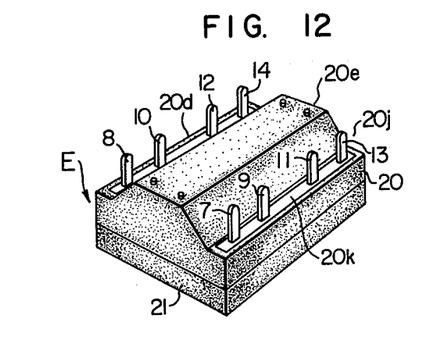
FIG. 12 is a perspective view showing the underside of the relay of FIG. 5.

The relay armature 7 is arranged in such a manner that the vertical portion 17a thereof is opposed to the core end 1b. The free end of the horizontal portion 17b of the relay armature 17 is fitted with an actuator 18. The respective ends 18a and 18b of the actuator 18 are situated below the movable contact members 15 and 16 of the contact blocks B and C, so that at the time of attraction of the vertical portion 17a to the core end 1b, the ends 18a and 18b of the actuator 18 press the movable contact members 15 and 16 upward simultaneously into contact with the normally-open contacts 13a and 14a respectively. When the electromagnet block A is de-energized, the relay armature 17 is of course restored to the original condition thereof by the restoration power of the movable contact members 15 and 16, so that the movable contact members 15 and 16 are brought into contact with the normally-closed contacts 11a and 12a at the same time. The actuator 18, as shown in FIGS. 10 and 11, has a section formed into the shape of ⊂, and a protrusion 18d is formed on the lower side of the upper portion 18c thereof. On the other hand, the free end part of the relay armature 17 has a hole 17c. The free end of the relay armature 17 is held between the upper and lower portions 18c and 18e of the actuator 18 with the protrusion 18d fittingly engaged with the hole 17c, thereby securing the actuator 18 to the relay armature 17. Numeral 19 shows a tension plate of a thin material bent in the form of ⌈, which is secured to the ends of the contact blocks B and C at the vertical portion 19a thereof. A protrusion 17d formed on the upper surface of the end portion of the horizontal portion of the relay armature 17 is fitted into a through hole 19c of the horizontal portion 19b of the tension plate 19, thus preventing the removal of the relay armature 17. The tension plate 19 has a vertical portion 19a with the central part thereof cut to form two outwardly elastic legs 19d, 19d. Also, engaging steps 19e, 19e are formed on the lower outer sides of the legs 19d, 19d, that is, recesses 19g, 19g are formed in the same sides. Vertical slots 5d and 6d are formed in the opposed inner sides of one end part of each of the insulating mounts 5 and 6 of the contact blocks B and C respectively. The vertical slots 5d and 6d have engaging steps 5e and 6e respectively at the lower part thereof, that is, protrusions 5g and 6g to be fitted into the recesses 19g. (FIG. 8) The side edges of the legs 19d, 19d of the tension plate 19 are fitted into the vertical slots 5d, 6d from the top thereof, so that the engaging steps 19e, 19e of the legs 19d, 19d are engaged with the engaging steps 5d, 6e of the vertical slots 5d, 6d by utilization of the elasticity of the legs 19d, 19d. The side ends of the vertical portion 19a of the tension plate 19 have bent parts 19f, 19f, which are also fitted into the vertical slots 5d, 6d, thus eliminating the loosened condition which otherwise might occur in the state where the side edges of the legs 19d, 19d are fitted into the vertical slots 5d, 6d.

As mentioned above, according to the present invention, the electromagnet block A, contact blocks B and C, and the relay armature 17 are coupled with each other to construct the electromagnet relay-contact assembly D having the functions of a relay as an integral block.

Next, the electromagnet relay-contact assembly D is contained in a space defined by the upper wall, side walls and bottom wall of the housing E, thus completing a miniature relay. The housing E includes a base portion 20 having a bottom wall and part of side walls, and a cover portion 21 having the remainder of the side walls and an upper wall which is covered over the base portions 20. Though the cover portion 21 may be opaque, it is preferable to make the cover portion 21 transparent so as to enable external inspection of the operating conditions of the inner relay contacts. Protrusions 5f and 6f are formed on the outer sides of the insulating members 5 and 6 of the contact blocks B and C and engaged with the recesses 20a, 20a formed in the opposed side surfaces of the base portion 20, thus fittingly mounting the assembly in the base portion 20. According to the present invention, the base portion 20 has steps 20b, 20b on the opposed inner sides thereof, on which the lower ends of the insulating member 5 and 6 rest respectively when the electromagnet contact-relay assembly D is placed in the housing E. An inverted trapezoidal space 20c is formed adjacent to and between the steps 20b, 20b for containing the lower halves of the flanges 3b, 3b of the bobbin 3 and the electromagnetic coil 2. In this way, the inside of the base portion 20 is formed to conform to the outline of the electromagnet relay-contact assembly D in such a manner as to eliminate any useless space other than the minimum required for containing the assembly D. The outside of the bottom wall of the base portion 20 is formed similarly to the steps 20b, 20b and the inverted trapezoidal space 20c inside of the base portion 20. In other words, it comprises first flat bottom surfaces 20d, 20d and an inverted trapezoidal expansion 20e connected with the first flat bottom surfaces 20d, 20d. The bottom surface of the expansion 20e is called the second flat bottom surface 20f. Holes 20g and 20h for accomodating terminals are bored through the bottom wall at the inner steps 20b, 20b and the corresponding first flat bottom surfaces 20d, 20d of the base portion 20 respectively. When the electromagnet relay-contact assembly D is contained in the base portion 20, the electromagnet relay-contact assembly D is positioned along the inner contour of the base portion 20 with the result that the terminals 7, 9, 11, 13 and 8, 10, 12, 14 of the contact blocks B and C are protruded downward from the bottom surfaces 20d, 20d via the through holes 20g and 20h respectively.

It will be seen from the foregoing description that according to the present invention the terminals 7, 9, 11, 13 and 8, 10, 12, 14 are arranged in parallel to each other in the spaces 20i, 20i partially defined by the first flat bottom surfaces 20d, 20d and the expansion 20e, at the sides of the expansion 20e of the bottom wall of the base portion 20.

Further, in the base portion 20 according to the present invention, ribs 20j, 20j are formed along the periphery of the first flat bottom surfaces 20d, 20d, thereby forming longitudinal recesses 20k, 20k between the sides of the expansion 20e and the ribs 20j, 20j. By filling a resin material into the recesses 20k, 20k, the through holes 20g, 20h for accomodating the terminals are hermetically sealed.

Figure 14:
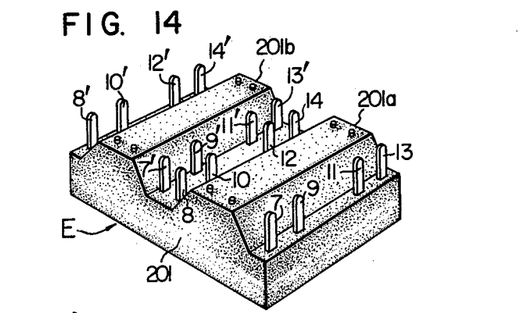
FIG. 14 is a perspective view showing the underside of another embodiment of the relay according to the present invention.
Figure 15:
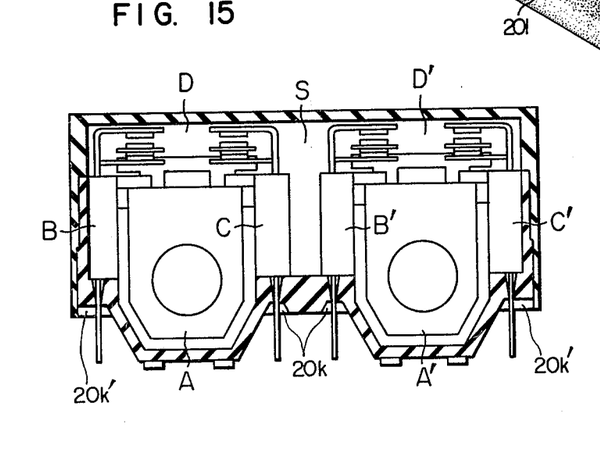
FIG. 15 is a longitudinal sectional view showing the relay of FIG. 14.

FIGS. 14 and 15 show another embodiment of the present invention, in which a pair of electromagnet relay-contact assemblies D and D' are contained in a single base portion 201. In this case, two expansions 201a and 201b are formed correspondingly to the electromagnet relay-contact assemblies D and D' respectively, so that the terminals 7, 9, 11, 13 and 8, 10, 12, 14 of the electromagnet relay-contact assembly D and the terminals 7', 9', 11', 13' and 8', 10', 12', 14' are arranged in parallel to each other at the sides of the expansions 201a and 201b respectively.

According to the related regulations on standards, adjacent terminal groups, for instance, the terminal group of the electromagnet relay-contact assembly D including 8, 10, 12 14 and the terminals 5 group of the electromagnet relay-contact assembly D' including 7', 9', 11', 13' are required to be spaced by a predetermined distance from each other. As a result, a space S is provided between the contact block C of the electromagnet relay-contact assembly D and the contact block B' of the electromagnet relay-contact assembly D' as shown in FIG. 15. This space S may be used to arrange indication means such as illumination means including light-emitting diodes (not shown) for indicating the operating conditions of the electromagnet relay-contact assemblies D and D'. In this case, the cover portion of the housing E is of course made transparent.

The present invention may be embodied with equal effect in an arrangement in which three or more electromagnet relay-contact assemblies are contained in a single space.

Figure 16:
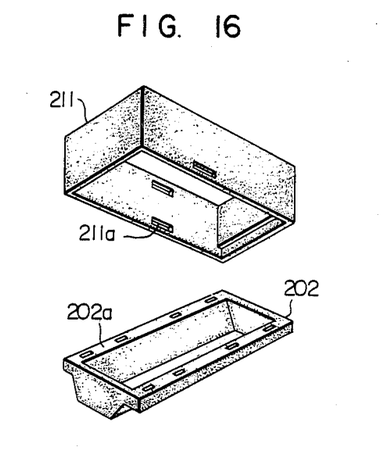
FIG. 16 is a perspective view showing another embodiment of the housing according to the present invention.

The base portion according to the present invention is alternatively constructed as shown in FIG. 16. In this embodiment, the base portion 202 has only the bottom wall of the housing, for containing the part of the electromagnet relay-contact assembly D lower than the lower end surfaces of the insulating mounts 5 and 6, while the remaining part is contained in the cover portion 211 including the side and upper walls. The lower ends of the insulating mounts 5 and 6 of the electromagnet relay-contact assembly D are rested on the side rims 202a, 202a of the base portion 202. The inside surface of the cover portion 211 is provided with engaging recesses 211a, 211a, with which the protrusions 5f, 6f on the sides of the insulating mounts 5 and 6 are engaged fixedly.

Instead of provision of the ribs 20j (FIG. 7) in the preceding embodiments, whether in the case where only one electromagnet relay-contact assembly is provided in the housing E or in the case where two or more than two electromagnet relay-contact assemblies are accomodated in the housing E, the longitudinal side wall of the cover portion of the housing E may be extended downwardly so as to form recesses 20k', 20k' in cooperation with the side wall of the expansion 20e, as shown in FIG. 15, in which a resin material may be filled to seal the relay in the same manner as already described with respect to the recesses 20k, 20k.

As another alternative not shown, each of the longitudinal ends of the base portion 20 forming the housing E has an opening which is closed by the side walls of the cover portion 21.

Further, the expansion 20e formed in the bottom wall of the base portion 20 may be rectangular or semicircular instead of inverted trapezoidal in shape.

Figure 17:
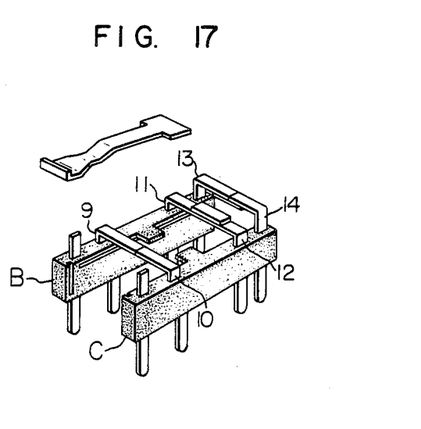
FIG. 17 is a perspective view showing another embodiment of the contact block.

Although the embodiment mentioned above is of what is called double-pole type in which the electromagnet relay-contact assembly includes two contact blocks B and C, it may alternatively be constructed as a single pole type in which the electromagnet relay-contact assembly includes one of the contact blocks B and C and the other block is replaced by a dummy block having only coil terminals. As another alternative, the common terminals 9, 10, the normally-closed contact terminals 11, 12, and the normally open contact terminals 13, 14 may be connected to each other respectively at the upper end bent portions thereof as shown in FIG. 17, thus constituting a single pole type of assembly with double current capacity.

Figure 18:
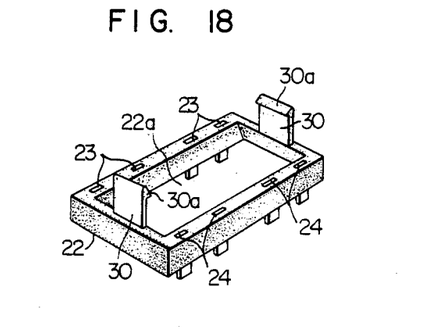
FIG. 18 is a perspective view of a socket for mounting the relay according to the present invention.
Figure 19:
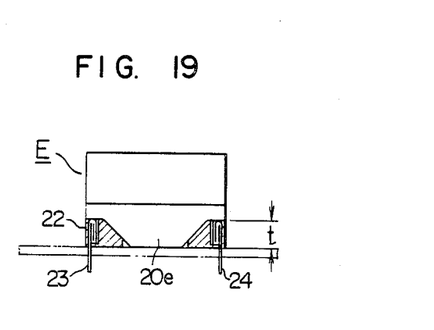
FIG. 19 is a longitudinal sectional view showing the condition in which the relay according to the present invention is mounted on the socket.

The miniature relay according to the invention constructed as mentioned above may also include a socket 22 having a central aperture 22a and plug-receiving terminals 23 and 24 parallelly provided on both sides opposedly to each other as shown in FIG. 18. In the case where the assembly is mounted on this socket 22 as shown in FIG. 19, the expansion 20e is fitted into the aperture 22a and the terminals 7, 9, 11, 13 and 8, 10, 12, 14 are inserted into the plug-receiving terminals 23 and 24 respectively. As a result, the first flat bottom surfaces 20d, 20d of the base portion 20 are mounted on the upper surface of the socket 22. In other words, by rendering the height t of the socket 22 substantially equal to the vertical distance between the first bottom surfaces 20d, 20d and the second bottom surface 20f, it is possible to render the height T of the relay from the second bottom surface 20f to the upper surface thereof equal to the mounting height conveniently without being affected in mounting height by the socket 22.

Numeral 30 shows elastic arms rising from the upper surface of the socket 22 and having a horizontal protrusion. The relay is mounted in the socket 22 against the elasticity of the arms 30, and after it is mounted in the socket, the protrusions 30a function as a locking means.

Figure 20:
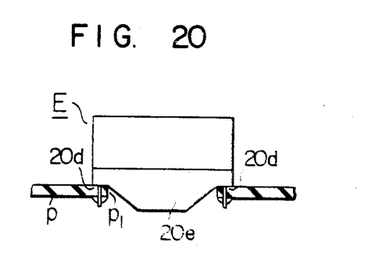
FIGS. 20 and 21 are longitudinal sectional views showing the relay according to the present invention directly mounted on the printed-circuit board.

FIG. 20 shows another method of mounting the relay according to the present invention directly on the printed-circuit board P. In this case, the printed-circuit board P is formed with an aperture P1 adapted to be fitted with the expansion 20e, and a plurality of terminal-receiving holes along the opposed two sides of the apertures P1. The expansion 20e is fitted into the aperture P1 so that the first flat bottom surfaces 20d, 20d are rested on the upper surface of the board P at the sides of the aperture P1. Thus the mounting height from the upper surface of the printed-circuit board P may be only about one half that of the relay proper.

Figure 21:
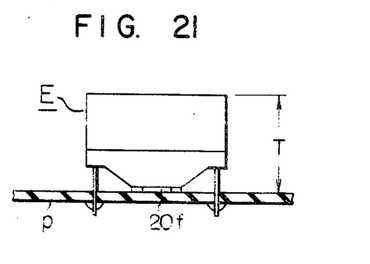

The relay according to the present invention may be mounted with the second bottom 20f rested on the printed-circuit board P as shown in FIG. 21, in which case, the advantage in respect of the mounting height is not attained like in the conventional relay-mounting methods. In this mounting method, however, the first flat bottom surfaces 20d, 20d from which the terminals are protruded are positioned over the printed-circuit board P in spaced relation therewith, resulting in the advantage of eliminating the effect of the penetration of solder flux between the relay bottom and the printed-circuit board or soldering heat on the internal parts which otherwise might occur in soldering the terminals. In using this method of mounting, the terminals are of course extended further downwardly of the second flat bottom surface 20f.

In asembly work of the relay according to the present invention, the electromagnet block A, the contact blocks B and C are prepared beforehand by the part-manufacturing processes therefor. In the final process, the electromagnet block A, the contact blocks B, C and the relay armature 17 are coupled with each other by simple pressure fitting, thereby completing the electromagnet relay-contact assembly, which is then contained in the housing E. In this way, the assembly work is very simple on the one hand, and blocks are used commonly to relays of different ratings, thus leading to the advantage in stock control on the other hand. Also, the construction according to the present invention totally eliminates wasteful space, thus greatly contributing to the reduced size of the relay. Still another advantage of the present invention lies in that regardless of whether the relay proper is mounted on the printed-circuit board directly or through a socket, the mounting height is greatly reduced. Especially when using the socket, the height thereof is capable of being ignored entirely to a very great practical advantage.

Although the above-mentioend embodiments are explained with reference to a relay with contacts, the essential parts of the present invention may of course be applied with equal effect to a reed relay and a contactless relay.

We claim:

1. An electromagnet relay comprising:
   A. at least one electromagnet relay-contact assembly including
      (i) relay contact means including at least one of a normally-open relay contact and a normally-closed relay contact,
      (ii) electromagnet means including an elongated iron core, a coil wound on said iron core, and a relay armature actuated by the energization of said coil to actuate said relay contact means, and
      (iii) a plurality of lead-out terminals for said relay contact means and said coil; and
   B. a housing including an upper wall, side walls and a bottom wall for containing said relay-contact assembly in the inner space defined by said upper, side and bottom walls, said bottom wall having a downwardly-protruded expansion extending longitudinally substantially over the entire length of the outer surface of said bottom wall and a plurality of flat portions connected with and extending along said expansion, said lead-out terminals being led out of said housing through said bottom wall at least at one of said flat portions.

2. An electromagnet relay according to claim 1, wherein said bottom wall includes, in the inside surface thereof, a recess corresponding to said expansion and shoulders corresponding to said flat portions and connected with said recess, said recess having such a shape and size that substantially the lower half of said coil is contained within said recess with the lower surface of said coil being substantially kept in contact with the inner contour of said recess, said relay contact means being disposed within the upper part of said inner space which is substantially defined by the surface of substantially the upper half of said coil, said shoulders of said bottom wall, said side walls, and said upper wall, said lead-out terminals being led out of said housing through at least one of said shoulders and the corresponding one of said flat portions of said bottom wall.

3. An electromagnet relay according to claim 2, wherein said electromagnet means includes a yoke having a horizontal portion extending over said coil in the longitudinal direction of said coil and a vertical portion extending downward substantially perpendicularly to said horizontal portion thereof, an end of said iron core being fixed to said vertical portion, and a spring plate having a horizontal portion extending longitudinal direction of said coil and a vertical portion extending downward substantially perpendicularly to said horizontal portion thereof, said relay armature including a horizontal portion extending in the longitudinal direction of said coil and a vertical portion extended downward substantially perpendicularly to said horizontal portion thereof, said relay armature being swingingly supported, at its bent portion, between the free end of said horizontal portion of said yoke and the bent portion of said spring plate in such a manner that said vertical portion of said relay armature is opposed to the other end of said iron core so that said vertical portion of said relay armature is attracted to the other end of said iron core thereby to actuate said relay contact means when said coil is energized.

4. An electromagnet relay according to claim 3, wherein said relay contact means includes a pair of insulator members extending in the longitudinal direction of said coil and mounted on said respective shoulders within said upper part of said inner space, preselected one of said insulator members being embedded with first, second, third, fourth and fifth conductors which penetrate through said preselected insulator member vertically and extend upward and downward therefrom, those parts of said first, second, third, fourth and fifth conductors which extend downward from said preselected insulator member constituting said lead-out terminals, the upper ends of said first and second conductors being connected to the starting and tail ends of said coil respectively, said third and fourth conductors being respectively formed at the upper ends thereof with a first upward and a second downward stationary contact, the former being lower thatn the latter in height from said preselected insulator member, said fifth conductor having its upper end to which an end of a movable contact member of an elastic conductor is secured, said movable contact member extending in the longitudinal direction of said coil between said first and second stationary contacts, said movable contact member normally being kept in contact with said first stationary contact by the elasticity thereof to constitute a normally-closed contact and being separated from said second stationary contact to constitute a normally-open contact, said movable contact member being adapted to be actuated against the elasticity thereof by said relay armature to open and close said normally-closed contact and said normally-open contact respectively, upon the energization of said coil.

5. An electromagnet relay according to claim 3, wherein said relay contact means includes a pair of insulator members extending in the longitudinal direction of said coil and mounted on said respective shoulders within said upper part of said inner space, each of said insulator members being embedded with first, second, third and fourth conductors which penetrate through said insulator member vertically and extend upwardly and downwardly threrefrom, those parts of said first, second, third and fourth conductors which extend downward from each of said insulator members constituting said lead-out terminals, the upper ends of said first conductors of said respective insulator members being connected to the starting and tail ends of said coil, said second and third conductors of each of said insulator members being respectively formed at the upper ends thereof with a first upward and a second downward stationary contact, the former being lower than the latter in height from said insulator member, said fourth conductor of each of said insulator members having its upper end to which an end of a movable contact member of an elastic conductor is secured, said movable contact member of each of said insulator members extending in the longitudinal direction of said coil between said first and second stationary contacts, said movable contact member normally being kept in contact with said first stationary contact by the elasticity thereof to constitute a normally-closed contact and being separated from said second stationary contact to constitute a normally-open contact, said movable contact member being adapted to be actuated against the elasticity thereof by said relay armature to open and close said normally-closed contact and said normally-open contact respectively, upon the energization of said coil.

6. An electromagnet relay according to claim 3, wherein said relay contact means includes a pair of insulator members extending in the longitudinal direction of said coil and mounted on said respective shoulders within said upper part of said inner space, each of said insulator members being embedded with first, second, third and fourth conductors which penetrate through said insulator members vertically and extend upward and downward therefrom, those parts of said first, second, third and fourth conductors which extend downward from each of said insulator members constituting said lead-out terminals, the upper ends of said first conductors on said respective insulator members being connected to the starting and tail ends of said coil respectively, said second and third conductors of preselected one of said insulator members being formed at the upper end thereof with a first upward and a second downward stationary contact, the former being lower than the latter in height from said preselected insulator members, said fourth conductor having its upper end to which an end of a movable contact member of an elastic conductor is secured, said movable contact member extending in the longitudinal direction of said coil between said first and second stationary contacts, said movable contact member normally being kept in contact with said first stationary contact by the elasticity thereof to constitute a normally-closed contact and being separated from said second stationary contact to constitute a normally-open contact, said movable contact member being adapted to be actuated against the elasticity thereof by the relay armature, upon the energization of said coil, to open and close said normally-closed contact and normally-open contact respectively.

7. An electromagnet relay according to claim 3, wherein said relay contact means includes a pair of insulator members extending in the longitudinal direction of said coil and mounted on said respective shoulders within said upper part of said inner space, each of said insulator members being embedded with first, second, third and fourth conductors which penetrate through said insulator members vertically and extend upward and downward therefrom, those parts of said first, second third and fourth conductors which are extended downward from said insulator members constituting said lead-out terminals, the upper ends of said first conductors on said respective insulator members being connected to the start and tail ends of said coil respectively, the upper ends of said second conductors of said respective insulator members being connected electrically with each other and having a first upward stationary contact formed on the connection therebetween, the upper ends of said third conductors of said respective insulator members being electrically connected with each other and having a second downward stationary contact formed on the connection therebetween, said first upward stationary contact being positioned lower than said second downward stationary contact in height from said respective insulator members, the upper ends of said fourth conductors of said respective insulator members being electrically connected with each other and an end of a movable contact member of an elastic conductor being secured to the connection therebetween, said movable contact member extending in the longitudinal direction of said coil between said first and second stationary contacts, said movable contact member being kept in contact with said first stationary contact by the elasticity thereof to constitute a normally-closed contact and being separated from said second stationary contact to constitute a normally-closed contact, said movable contact member being adapted to be actuated against the elasticity thereof by said relay armature, upon the energization of said coil, to open and close said normally-closed contact and normally-open contact respectively.

8. An electromagnet relay according to any one of claims 3, 4, 5, 6 and 7, further comprising first engaging means for causing said yoke to engage each of said respective insulator members, and second engaging means for causing said spring plate member to engage each of said respective insulator members.

9. An electromagnet relay according to claim 8, wherein said first engaging means includes a pair of first slots formed in the opposed surfaces of said respective insulator members for receiving the longitudinal edges of the horizontal portion of said yoke, a pair of tongues formed on the opposed surfaces of said respective insulator members and protruded inwardly, each of said tongues including a downward protrusion at the free end thereof, and a pair of apertures formed in said horizontal portion of said yoke for receiving said protrusions of said respective tongues, and wherein said second engaging means includes a pair of second slots formed in the opposed surfaces of said respective insulator members for receiving the side edges of the vertical portion of said spring plate member.

10. An electromagnet relay according to claim 9, wherein said vertical portion of said spring plate member having a recess opened to the free end thereof to thereby form a pair of vertical legs having elasticity in the direction across said legs.

11. An electromagnet relay according to claim 10, wherein a protrusion is formed in each of said second slots to thereby provide a first step and a recess is formed in the outer side edge of each of said legs correspondingly to said protrusion in the associated one of said second slots, to thereby provide a second step, said first and second steps providing a lock engagement with each other when said side edges of said respective legs are correspondingly fitted into said second slots.

12. An electromagnet relay according to claim 10, wherein a part of the outer side edge of each of said legs is bent to eliminate the loosened condition which otherwise might occur when said side edges are correspondingly fitted into said respective second slots.

13. An electromagnet relay according to claim 9, wherein the free end of said horizontal portion of said yoke includes a recess for receiving the bent portion of said relay armature.

14. An electromagnet relay according to claim 9, wherein said relay armature is formed with an inwardly-directed protrusion at the bent portion thereof, and said yoke is formed with a recess for receiving said protrusion at the free end of the horizontal portion thereof.

15. An electromagnet relay according to claim 9, wherein the free end of the horizontal portion of said relay armature is covered with an insulating material.

16. An electromagnet relay according to claim 9, wherein a protrusion is provided on one of the horizontal portion of said relay armature and the horizontal portion of said spring plate member, and an aperture for receiving said protrusion is provided in the other.

17. An electromagnet relay according to claim 2, wherein said housing includes a first portion having said upper wall and said side walls, and a second portion having said bottom wall, said first and second portions being adapted to be removable fitted on each other.

18. An electromagnet according to claim 2, wherein said housing includes a first portion having said upper wall and a part of said side walls, and a second portion having said bottom wall and the remainder of said side walls, said first and second portions being adapted to be removably fitted on each other.

19. An electromagnet relay according to claim 8, wherein said housing including a first portion having said upper wall and said side walls, and a second portion having said bottom wall, said first and second portions being adapted to be removably fitted on each other, said electromagnet relay further comprising first engaging means for coupling said electromagnet contact means to said first portion and second engaging means for coupling said first portion to said second portion.

20. An electromagnet relay according to claim 19, wherein said first engaging means includes a first protrusion formed on the outer side surface of each of said respective insulator members and the corresponding inner surface of said side walls and a first recess formed in the other thereof, said first protrusion being adapted to be fitted into said first recess, said second engaging means including at least one second protrusion formed on one of the outer side surface of said bottom wall and the inner surface of said side walls and at least one second recess formed in the other thereof, said second protrusion being adapted to be fitted into said second recess.

21. An electromagnet relay according to claim 8, wherein said housing includes a first portion having said upper wall and a part of said side walls and a second portion having said bottom wall and the remainder of said side walls, said first and second portions being adapted to be removably fitted on each other, said electromagnet relay further comprising first engaging means for coupling said electromagnet contact means to said second portion and second engaging means for coupling said first portion to said second portion.

22. An electromagnet relay according to claim 21, wherein said first engaging means includes a first protrusion formed on one of the outer side surface of each of said respective insulator members and the corresponding inner surface of said remainder of said side walls, and a first recess formed in the other, said first protrusion being adapted to be fitted into said first recess, said second engaging means including at least one second protrusion formed on one of the inner surface of said part of said side walls and the inner surface of said remainder of said side walls and at least one second recess formed in the other, said second protrusion being adapted to be fitted into said second recess.

23. An electromagnet relay according to any one of claims 2, 3, 4, 5, 6, 7, 17 and 18, wherein the cross section of said expansion of said bottom is substantially semicircular in shape.

24. An electromagnet relay according to any one of claims 2, 3, 4, 5, 6, 7, 17 and 18, wherein the cross section of said expansion of said bottom is substantially inverted trapexoid in shape.

25. An electromagnet relay according to any one of claims 2, 3, 4, 5, 6, 7, 17 and 18 wherein the cross section of said expansion of said bottom is substantially rectangular in shape.

26. An electromagnet relay according to any one of claims 2, 3, 4, 5, 6 and 7, wherein said bottom wall includes a rib extended longitudinally along the outer periphery of each of said first portions, thereby forming a recess between said rib and each side surface of said expansion, said recess being filled with a resin material to thereby hermetically seal that part of said bottom wall through which said lead-out terminal means are passed.

27. An electromagnet relay according to any one of claims 2, 3, 4, 5, 6 and 7, wherein said side walls of said housing are extended downwardly so as to form recesses in cooperation with the side surfaces of said expansion, said recesses being filled with a resin material to thereby hermetically seal that part of said bottom wall through which said lead-out terminal means are passed.

28. An electromagnet relay according to claim 2, further comprising a socket unit including a base portion, said base portion having at the central part thereof an aperture sufficiently large to accomodate the whole of said expansion of said bottom wall, said base portion including a plurality of holes for receiving said leadout terminals, said socket unit further including second lead-out terminals extended downwardly through said holes of said base portion, said second lead-out terminals being electrically connected with said first-mentioned lead-out terminals when said first-mentioned lead-out terminals are inserted into said holes.

29. An electromagnet relay according to claim 28, wherein the height of said base portion is substantially the same as that of said expansion of said bottom wall.

30. An electromagnet relay according to claim 28 or claim 29, wherein said socket unit includes a pair of elastic arms rising from the upper surface of said base portion and opposed to each other over said aperture, each of said elastic arms including a free end having a horizontal protrusion directed inwardly, the distance between the opposed surfaces of said arms being substantially equal to the length of said housing in the longitudinal direction of said coil, the height from the upper surface of said base portion to the lower surface of said horizontal protrusion being substantially equal to the height of said housing.

* * * * *